(12) United States Patent
Feng et al.

(10) Patent No.: US 8,970,126 B2
(45) Date of Patent: Mar. 3, 2015

(54) OPTO-ELECTRONIC DEVICES AND METHODS

(71) Applicant: The Board Of Trustees Of The University Of Illinois, Urbana, IL (US)

(72) Inventors: Milton Feng, Champaign, IL (US); Nick Holonyak, Jr., Urbana, IL (US); Chao-Hsin Wu, Taipei (TW)

(73) Assignee: The Board Of Trustees Of The University Of Illinois, Urbana, IL (US)

( * ) Notice: Subject to any disclaimer, the term of this patent is extended or adjusted under 35 U.S.C. 154(b) by 332 days.

(21) Appl. No.: 13/633,383

(22) Filed: Oct. 2, 2012

(65) Prior Publication Data

US 2013/0093352 A1    Apr. 18, 2013

Related U.S. Application Data

(60) Provisional application No. 61/627,231, filed on Oct. 7, 2011, provisional application No. 61/686,114, filed on Mar. 30, 2012.

(51) Int. Cl.
| | | |
|---|---|---|
| *H01L 33/58* | (2010.01) | |
| *H05B 37/00* | (2006.01) | |
| *H01S 5/062* | (2006.01) | |
| *H01S 5/50* | (2006.01) | |
| *H01L 33/00* | (2010.01) | |
| *H01L 33/02* | (2010.01) | |
| *H01L 33/38* | (2010.01) | |

(52) U.S. Cl.
CPC .............. *H01L 33/58* (2013.01); *H05B 37/00* (2013.01); *H01S 5/06203* (2013.01); *H01S 5/509* (2013.01); *H01L 33/0041* (2013.01); *H01L 33/02* (2013.01); *H01L 33/38* (2013.01)

USPC ............................................. 315/291; 257/98

(58) Field of Classification Search
USPC .......................... 315/291, 294, 297, 308, 363; 257/78–103
See application file for complete search history.

(56) References Cited

U.S. PATENT DOCUMENTS

| | | | |
|---|---|---|---|
| 4,710,936 A | 12/1987 | Shibata et al. | 372/45 |
| 5,796,714 A | 8/1998 | Chino et al. | 372/50 |
| 6,479,844 B2 | 11/2002 | Taylor | 257/192 |
| 6,727,530 B1 | 4/2004 | Feng et al. | 257/184 |
| 6,974,969 B2 | 12/2005 | Taylor | 257/24 |

(Continued)

FOREIGN PATENT DOCUMENTS

JP           61270885          12/1986

OTHER PUBLICATIONS

Ledistor—A Three Terminal Double Heterostructure Optoelectronic Switch, G.W. Taylor et al., Appl. Phys. Lett. 50, 6 (1987).

(Continued)

*Primary Examiner* — Tung X Le
*Assistant Examiner* — Jonathan Cooper
(74) *Attorney, Agent, or Firm* — Martin Novack (57) ABSTRACT

A method for amplifying an input optical signal includes the following steps: providing a light-emitting transistor device having a base region between collector and emitter regions; applying electrical signals with respect to the base, collector, and emitter regions to produce light emission from the base region of the light-emitting transistor device; and applying the input optical signal to the base region of the light-emitting transistor device to produce an amplified optical output from the base region.

29 Claims, 6 Drawing Sheets

(56) References Cited

U.S. PATENT DOCUMENTS

| | | | |
|---|---|---|---|
| 7,091,082 B2 | 8/2006 | Feng et al. | 438/235 |
| 7,247,892 B2 | 7/2007 | Taylor | 257/197 |
| 7,286,583 B2 | 10/2007 | Feng et al. | 372/30 |
| 7,354,780 B2 | 4/2008 | Feng et al. | 257/292 |
| 7,535,034 B2 | 5/2009 | Walter et al. | 372/43 |
| 7,711,015 B2 | 5/2010 | Holonyak, Jr. et al. | 372/11 |
| 7,813,396 B2 | 10/2010 | Feng et al. | 372/43.01 |
| 7,998,807 B2 | 8/2011 | Feng et al. | 438/235 |
| 2005/0040387 A1 | 2/2005 | Feng et al. | 257/14 |
| 2005/0040432 A1 | 2/2005 | Feng et al. | 257/198 |
| 2005/0054172 A1 | 3/2005 | Feng et al. | 438/313 |
| 2008/0089368 A1 | 4/2008 | Feng et al. | 372/25 |
| 2008/0240173 A1 | 10/2008 | Holonyak et al. | 372/9 |
| 2009/0134939 A1 | 5/2009 | Feng et al. | 327/581 |
| 2010/0034228 A1 | 2/2010 | Holonyak et al. | 374/45 |
| 2010/0073086 A1 | 3/2010 | Holonyak, Jr. et al. | 330/149 |
| 2010/0103971 A1 | 4/2010 | Then et al. | 372/45.01 |
| 2010/0202483 A1 | 8/2010 | Walter et al. | 372/45.01 |
| 2010/0202484 A1 | 8/2010 | Holonyak, Jr. et al. | 372/45.01 |
| 2010/0272140 A1 | 10/2010 | Walter et al. | 372/38.02 |
| 2010/0289427 A1 | 11/2010 | Walter et al. | 315/219 |
| 2010/0315018 A1 | 12/2010 | Then et al. | 315/219 |
| 2011/0150487 A1 | 6/2011 | Walter | 398/115 |
| 2012/0038960 A1 | 2/2012 | Then et al. | 359/108 |
| 2012/0068151 A1 | 3/2012 | Walter | 257/9 |

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation of a Heterojunction Bipolar Light-Emitting Transistor, G. Walter, N. Holonyak, Jr., M. Feng, and R. Chan, Appl. Phys. Lett. 85, 4768 (2004).

Microwave Operation and Modulation of a Transistor Laser, R. Chan, M. Feng, N. Holonyak, Jr., and G. Walter, Appl. Phys. Lett. 86, 131114 (2005).

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan , N. Holonyak, Jr. , A. James , G. Walter, Appl. Phys. Lett. 88, 143508 (2006).

Collector Breakdown in the Heterojunction Bipolar Transistor laser, G. Walter, A. James, N. Holonyak, Jr., M. Feng, and R. Chan, Appl. Physics Lett. 88, 232105 (2006).

High-Speed ($\geq$ 1 GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp in a Transistor Laser: Franz-Keldysh Reduction of the Linewidth Enhancement, G. Walter, A. James, N. Holonyak, Jr., and M. Feng, App. Phys. Lett. 90, 091109 (2007).

Photon-Assisted Breakdown, Negative Resistance, and Switching in a Quantum-Well Transistor Laser, A. James, G. Walter, M. Feng, and N. Holonyak, Jr., Appl. Phys. Lett. 90, 152109 (2007).

Franz—Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination of the Effective Minority Carrier Lifetime in the Operation of a Quantum-Well n-p-n Heterojunction Bipolar Light-Emitting Transistor of Varying Base Quantum-Well Design and Doping; H.W. Then, M. Feng, N. Holonyak, Jr., and C. H. Wu, Appl. Phys. Lett. 91, 033505 (2007).

Charge Control Analysis of Transistor Laser Operation, M. Feng, N. Holonyak, Jr., H. W. Then, and G. Walter, Appl. Phys. Lett. 91, 053501 (2007).

Optical Bandwidth Enhancement by Operation and Modulation of the First Excited State of a Transistor Laser, H. W. Then, M. Feng, and N. Holonyak, Jr., Appl. Phys. Lett. 91, 183505 (2007).

Modulation of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics and the Differential Optical Gain of a Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 μm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement of Heterojunction Bipolar Transistor Laser Operation With an Auxiliary Base Signal, H.W. Then, G. Walter, M. Feng, and N. Holonyak, Jr., Appl. Phys. Lett. 93, 163504 (2008).

Bandwidth Extension by Trade-Off of Electrical and Optical Gain in a Transistor Laser: Three-Terminal Control, H. W. Then, M. Feng, and N. Holonyak, Jr., Appl. Phys. Lett. 94, 013509 (2009).

Tunnel Junction Transistor Laser, M. Feng, N. Holonyak, Jr., H. W. Then, C. H. Wu, and G. Walter, Appl. Phys. Lett. 94, 041118 (2009).

Electrical-Optical Signal Mixing and Multiplication (2→GHz) With a Tunnel Junction Transistor Laser, H.W. Then, C.H. Wu, G. Walter, M. Feng and N. Holonyak, Jr., Appl. Phys. Lett. 94, 10114 (2009).

Scaling of Light Emitting Transistor for Multigigahertz Optical Bandwidth, C.H. Wu, G. Walter, H.W. Then, M. Feng and N. Holonyak, Jr., Appl. Phys. Lett. 94, 171101 (2009).

Device Performance of Light Emitting Transistors With C-Doped and Zn-Doped Base Layers, Y. Huang, J.-H. Ryou, R.D. Dupuis, F. Dixon, N. Holonyak, Jr., and M. Feng, IPRM '09 IEEE Intl. Conf. May 10-14, 2009.

Tilted-Charge High Speed (7 GHz) Light Emitting Diode, G. Walter, C. H. Wu, H. W. Then, M. Feng, and N. Holonyak, Jr., Appl. Phys. Lett. 94, 231125 (2009).

4.3 GHz Optical Bandwidth Light Emitting Transistor, G. Walter, C. H. Wu, H. W. Then, M. Feng, and N. Holonyak, Jr., Appl. Phys. Lett. 94, 241101 (2009).

Resonance-Free Frequency Response of a Semiconductor Laser, M. Feng, H. W. Then, N. Holonyak, Jr., G. Walter, and A. James, Appl. Phys. Lett. 95, 033509 (2009).

4-GHz Modulation Bandwidth of Integrated 2×2 LED Array, Chao-Hsin Wu; Walter, G.; Han Wui Then; Feng, M.; Holonyak, N.; Photonics Technology Letters, IEEE vol. 21, Issue: 24 (2009).

Physics of Base Charge Dynamics in the Three Port Transistor Laser, H. W. Then, M. Feng, and N. Holonyak, Appl. Phys. Lett. 96, 113509 (2010).

Microwave Circuit Model of the Three-Port Transistor Laser, H. W. Then, M. Feng, and N. Holonyak, J. Appl. Phys. 107, 094509 (2010).

Distributed Feedback Transistor Laser, F. Dixon, M. Feng, and N. Holonyak, Appl. Phys. Lett. 96, 241103 (2010).

(56) References Cited

OTHER PUBLICATIONS

Stochastic Base Doping and Quantum-Well Enhancement of Recombination in an n-p-n Light-Emitting Transistor or Transistor Laser, H. W. Then, C. H. Wu, M. Feng, N. Holonyak, and G. Walter, Appl. Phys. Lett. 96, 263505 (2010).

Design and Operation of Distributed Feedback Transistor Lasers, F. Dixon, M. Feng, and N. Holonyak, Jr., Journal of Appl. Physics 108, 093109 (2010).

Temperature Dependence of a High-Performance Narrow-Stripe (1 μm) Single Quantum-Well Transistor Laser, M. Feng, N. Holonyak, Jr. and A. James, Appl. Physics Letters 98, 051107 (2011).

InP/InAlGaAs Light-Emitting Transistors and Transistor Lasers With a Carbon-Doped Base Layer, Yong Huang, Jae-Hyun Ryou, Russell Dupuis, Forest Dixon, Milton Feng, and Nick Holonyak, Jr., Journal of Appl. Physics 109, 063106 (2011).

Bandfilling and Photon-Assisted Tunneling in a Quantum-Well Transistor Laser, M. Feng, R. Bambery, and N. Holonyak, Jr., Appl. Physics Letters 98, 123505 (2011).

OPTO-ELECTRONIC DEVICES AND METHODS

PRIORITY CLAIMS

Priority is claimed from U.S. Provisional Patent Application No. 61/627,231, filed Oct. 7, 2011 and priority is also claimed from U.S. Provisional Patent Application No. 61/686,114, filed Mar. 30, 2012, and both of said U.S. Provisional Patent Applications are incorporated herein by reference.

RELATED APPLICATIONS

Some of the subject matter of the present Application is related to some of the subject matter of the U.S. patent application Ser. No. 13/633,440, filed of even date herewith, and assigned to the same assignee as the present Application.

FIELD OF THE INVENTION

This invention relates to the field of opto-electronic devices and techniques and, more particularly, to such circuits and techniques that employ light-emitting transistors and/or transistor lasers.

BACKGROUND OF THE INVENTION

Semiconductor optical amplifiers (SOAs) have been widely used as in-line amplifiers in fiber-optic communication systems to boost the optical signal directly without requiring conversion to the electrical domain, saving the cost of regenerators and system complexity. The SOA functions like a laser without a feedback mechanism or cavity provided, and is called a traveling-wave amplifier. It is based on a two-terminal diode (p-i-n) structure to provide optical gain via current injection. SOAs can be integrated with other photonic components, such as lasers or modulators, for optical signal amplification or optical gating purposes and form a photonic integrated circuit (PIC).

A part of the background hereof lies in the development of heterojunction bipolar transistors which operate as light-emitting transistors and transistor lasers. Reference can be made for example, to U.S. Pat. Nos. 7,091,082, 7,286,583, 7,354,780, 7,535,034, 7,693,195, 7,711,015, 7,813,396, 7,888,119, 7,888,625, and 7, 953,133; U.S. Patent Application Publication Numbers US2005/0040432, US2005/0054172, US2008/0240173, US2009/0134939, US 2010/0315018, and US2010/0103971; and to PCT International Patent Publication Numbers WO/2005/020287 and WO/2006/093883. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak and M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); Collector Current Map Of Gain And Stimulated Recombination On The Base Quantum Well Transitions Of A Transistor Laser, R. Chan, N. Holonyak, Jr., A. James, and G. Walter, Appl. Phys. Lett. 88, 14508 (2006); Collector Breakdown In The Heterojunction Bipolar Transistor Laser, G. Walter, A. James, N. Holonyak, Jr., M. Feng, and R. Chan, Appl. Phys. Lett. 88, 232105 (2006); High-Speed (/spl ges/1 GHz) Electrical And Optical Adding, Mixing, And Processing Of Square-Wave Signals With A Transistor Laser, M. Feng, N. Holonyak, Jr., R. Chan, A. James, and G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction of The Linewidth Enhancement, G. Walter, A. James, N. Holonyak, Jr., and M. Feng, Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz-Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007); Experimental Determination Of The Effective Minority Carrier Lifetime In The Operation Of A Quantum-Well n-p-n Heterojunction Bipolar Light-Emitting Transistor Of Varying Base Quantum-Well Design And Doping; H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007); Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008); Optical Bandwidth Enhancement Of Heterojunction Bipolar Transistor Laser Operation With An Auxiliary Base Signal, H. W. Then, G. Walter, M. Feng, and N. Holonyak, Jr. Appl. Phys. Lett. 93, 163504 (2008); Bandwidth Extension By Trade-Off Of Electrical And Optical Gain In A Transistor Laser, Three-Terminal control, H. W. Then, M. Feng, and N. Holonyak, Jr. Appl. Phys. Lett. 94, 013509 (2009); Tunnel Junction Transistor Laser, M. Feng, N. Holonyak, Jr., H. W. Then, C. H. Wu, and G. Walter, Appl. Phys. Lett 94, 041118 (2009); Electrical-Optical Signal Mixing And Multiplication (2→22 GHz) With A Tunnel Junction Transistor Laser, H. W. Then, C. H. Wu, G. Walter, M. Feng, and N. Holonyak, Jr. Appl. Phys. Lett. 94, 101114 (2009); Scaling Of Light Emitting Transistor For Multigigahertz Optical Bandwidth, C. H. Wu, G. Walter, H. W. Then, M. Feng, and N. Holonyak, Jr., Appl. Phys. Lett, 94, 171101 (2009); Device Performance Of Light Emitting Transistors With C-Doped And Zn-Doped Base Layers, Y. Huang, J.-H. Ryou, R. D. Dupuis, F. Dixon, N. Holonyak, M. Feng, Indium Phosphide & Related Materials, 2009; IPRM '09. IEEE International Conference On 10-14 May 2009; Tilted-Charge High Speed (7 GHz) Light Emitting Diode, G. Walter, C. H. Wu, H. W. Then, M. Feng, and N. Holonyak, Jr. Appl. Phys. Lett. 94, 231125 (2009); 4.3 GHz Optical Bandwidth Light Emitting Transistor, G. Walter, C. H. Wu, H. W. Then, M. Feng, and N. Holonyak, Jr., Appl. Phys. Lett. 94, 241101 (2009); Resonance-Free Frequency Response Of A Semiconductor Laser, M. Feng, H. W. Then, N. Holonyak, Jr., G. Walter, and A. James, Appl. Phys. Lett. 95, 033509 (2009); 4-GHz Modulation Bandwidth of Integrated 2×2 LED Array, Chao-Hsin Wu; G. Walter, Han Wui Then, M. Feng, N. Holonyak, Photonics Technology Letters, IEEE Volume: 21, Issue 24, Publication Year: 2009, Page(s): 1834-1836, Date of Publication: 9 Nov. 2009; Physics Of Base Charge Dynamics In The Three Port Transistor Laser, H. W. Then, M. Feng, and N. Holonyak Appl. Phys. Lett. 96, 113509 (2010); Microwave Circuit Model Of The Three-Port Transistor Laser, H. W. Then, M. Feng, and N. Holonyak, J. Appl. Phys. 107, 094509 (2010); Distributed Feedback Transistor Laser, F. Dixon, M. Feng, and N. Holonyak; Appl. Phys. Lett. 96, 241103 (2010); Stochastic Base Doping And Quantum-Well Enhancement Of Recombination In An n-p-n Light-Emitting Transistor Or Transistor Laser, H. W. Then, C. H. Wu, M. Feng, N. Holonyak, and G. Walter, Appl. Phys. Lett. 96, 263505 (2010); Design And Operation Of Distributed Feedback Transistor Lasers, F. Dixon, M. Feng, and N. Holonyak, J. Appl. Phys. 108, 093109 (2010); and Temperature Dependence Of A High-Performance Narrow-Stripe (1 μm) Single Quantum-Well Transistor Laser, M. Feng, N. Holonyak, and A. James, Appl. Phys. Lett. 98, 051107 (2011). The foregoing documents describe, inter alia, the structure and operation of light-emitting transistors (LETs) and transistor lasers (TLs), at least some of which being of types that can be employed in making or practicing embodiments of the invention.

It is among the objectives hereof to improve on existing semiconductor optical amplifiers (SOAs) by improving one or more of the operation, versatility, flexibility, ease of integration, and cost of such devices. It is among the further objectives hereof to provide improved opto-electronic devices and methods.

SUMMARY OF THE INVENTION

An aspect of the present invention involves a new type of semiconductor optical amplifier that is based on a transistor structure (n-p-n or p-n-p) for light and/or laser amplification and detection, which, for laser operation, can be called a three-terminal transistor laser optical amplifier (TLOA). The TLOA is a multi-functional device that can be used in new-generation electron-photon integrated circuit chips which can generate and rout both electrical and optical signals to achieve new functions beyond current chips.

In accordance with a form of the invention there is set forth a four port opto-electronic device, comprising: a light-emitting semiconductor device that includes a base region between collector and emitter regions, a base terminal coupled with said base region, a collector terminal coupled with said collector region, and an emitter terminal coupled with said emitter region; an electrical input port defined between a first pair of terminals from among said base, collector, and emitter terminals, and an electrical output port defined between a second different pair of terminals from among said base, collector, and emitter terminals; an optical input port optically coupled with said base region; and an optical output port optically coupled with said base region.

In an embodiment of this form of the invention, the optical input port comprises an input optical waveguide and the optical output port comprises an output optical waveguide. The device can include an optical resonant cavity enclosing at least a portion of said base region, such that light emitted by said device comprises laser emission from said optical output port. The input and output optical waveguides can be integrated with a semiconductor structure forming said optoelectronic device.

In accordance with a further form of the invention, a method is set forth for amplifying an input optical signal, including the following steps: providing a light-emitting transistor device comprising a base region between collector and emitter regions; applying electrical signals with respect to said base, collector, and emitter regions to produce light emission from the base region of said light-emitting transistor device; and applying said input optical signal to the base region of said light-emitting transistor device to produce an amplified optical output from said base region.

An embodiment of this form of the invention further comprises providing an input optical port in optical communication with said base region, the input optical signal being coupled into said input optical port, and an output optical port in optical communication with said base region, the output optical signal being coupled into said output optical port. In a form of this embodiment, the step of providing a light-emitting transistor further comprises providing an optical resonant cavity enclosing at least a portion of said base region so that said light-emitting transistor operates as a transistor laser with the light emission from said base region comprising laser emission, and the amplified optical output comprising amplified laser emission. Electronic control signals can be applied to said transistor laser to control said amplified optical output. In a further form of this embodiment, base, collector, and emitter terminals are respectively coupled with said base, collector, and emitter regions, and an electrical input port is provided between a first pair of terminals from among said base, collector, and emitter terminals, and electronic control signals are applied to said electrical input port to control the amplified optical output.

The transistor optical amplifier (TOA) and transistor laser optical amplifier (TLOA) hereof will have an important role in the development of photonic integrated circuits due to their integration capability (transistor IC like) to other photonic components. Since $I_E = I_B + I_C$ and $\beta = I_C/I_B$, optical output is directly proportional to base current and collector current. The collector output ($I_C$) can be utilized as an electrical indicator to directly monitor the device's operation and offers electrical feedback to characterize the optical output performance. This is advantageous as compared to the conventional SOA in which a photodetector is required to monitor the optical output power and feedback control the input current. The devices hereof will reduce the cost and complexity in terms of chip size reduction, feedback circuit design, and simplification of component integration in photonic integrated circuits.

Further features and advantages of the invention will become more readily apparent from the following detailed description when taken in conjunction with the accompanying drawings.

DETAILED DESCRIPTION

Figure 1:
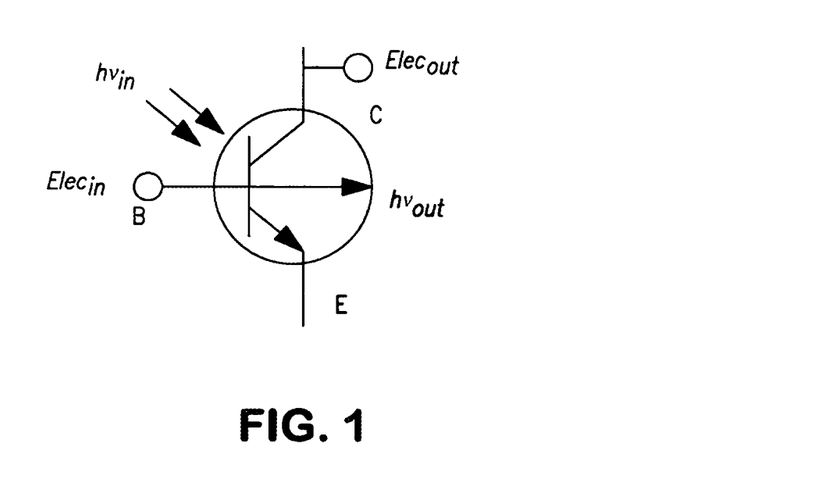
FIG. 1 is a simplified representation of the four port opto-electronic transistor device hereof and characteristics, showing electrical and optical inputs and electrical and optical outputs.
Figure 2:
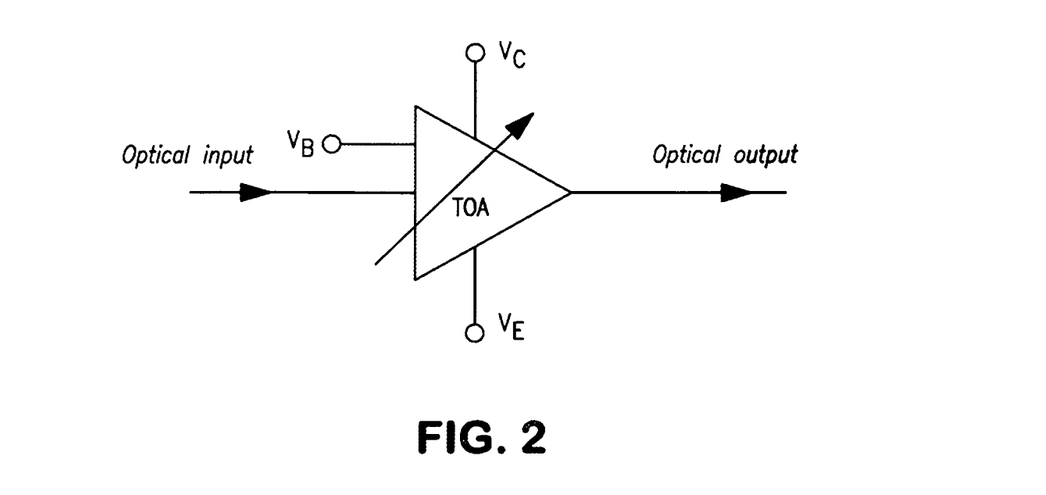
FIG. 2 is a diagram illustrating variable gain characteristics of the four port opto-electronic transistor device, showing operation as a variable gain optical device that can be used for amplification and/or attenuation.

FIGS. 1 and 2 are simplified diagrams of a variable-gain three-terminal four-port transistor optical amplifier (TOA) or transistor laser optical amplifier (TLOA). The device has an emitter terminal E, a base terminal B, and a collector terminal C. FIG. 1 presents a transistor-based circuit symbol of the device that indicates its "four-port" characteristics: electrical-in, electrical-out, optical-in, and optical-out. FIG. 2, shows a representation of the "variable-gain" optical amplifier hereof, which provides not only the capability of optical or laser amplification, but also attenuation.

In the illustration of FIG. 1, the device is operating in common emitter mode (it being understood that other operation configurations, including common collector mode or common base mode can also be used), with an electrical input, designated $Elec_{in}$ coupled to the base terminal B, and an electrical output signal, $Elec_{out}$, at the collector terminal C. An input optical signal, represented at $h\gamma_{in}$, is preferably coupled into the base of the device, for example using an optical fiber or any other suitable technique, such as a waveguide in an opto-electronic circuit. An optical output is designated $h\gamma_{out}$. As represented in FIG. 2, applied biasing voltages ($V_B$, $V_E$, and $V_C$) can be independently applied to control and switch between different operation modes depending on different functions required. The TOA or TLOA hereof functions differently from the conventional SOA by a third terminal to provide a controllable "variable gain", which can be used not only for light amplification but also attenuation and photodetection.

Figure 3:
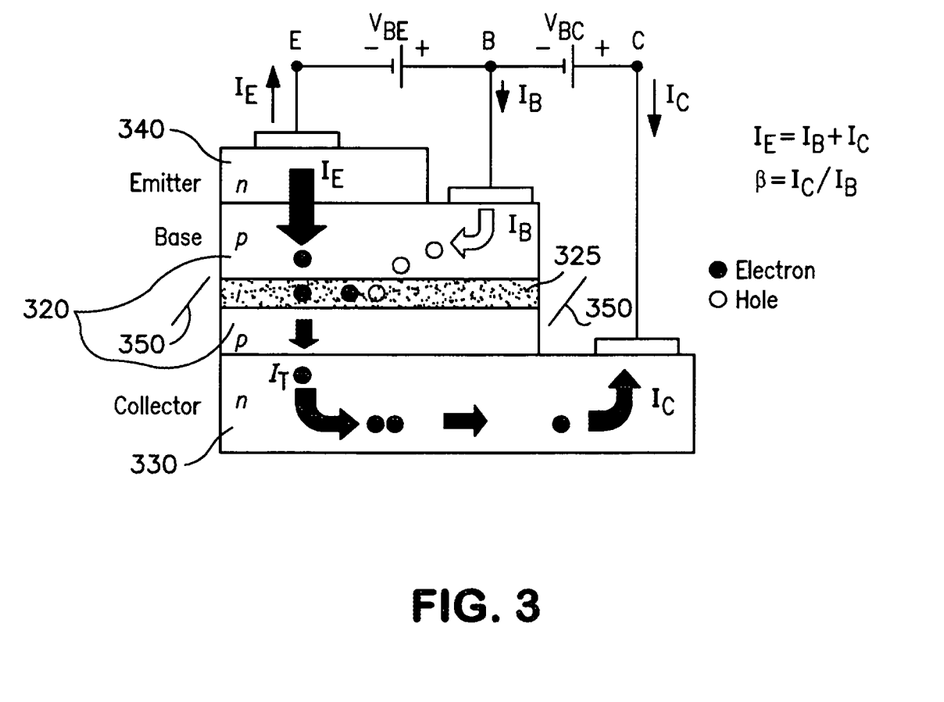
FIG. 3 is a schematic diagram, partially in cross-section, that illustrates operation of a device as will be modified and utilized for embodiments of the invention and used to practice embodiments of the method of the invention, and which shows, in simplified form, carrier flow in the device.

FIG. 3 shows a schematic diagram of the transistor-like device (npn, as in this example, or pnp), as will be modified and utilized in embodiments hereof. The device includes p-type base region 320 between n-type collector and emitter regions 330 and 340, respectively. The collector region 330 includes a subcollector that is not separately shown. In a light-emitting transistor (LET) or transistor laser (TL) the base region is typically heavily doped and contains one or more quantum size regions, such as undoped quantum wells 325. (For a transistor laser, an optical resonant cavity is represented in FIG. 3 at 350, and is implied in other diagrams hereof.) Reference can be made to the above-listed documents relating to LETs and TLs with regard to fabrication details. A bias voltage $V_{BE}$ is applied between base terminal B and emitter terminal E, and a bias voltage $V_{BC}$ is applied between base terminal B and collector terminal C. The solid arrows and dots illustrate the flow of electron carriers, and the outline arrows and dots illustrate the flow of hole carriers.

Three operation modes of the TLOA to be described are: (a) light amplification, (b) light attenuation, and (c) photodetection, depending on the applied voltages across the base-emitter ($V_{BE}$) and the base-collector junction ($V_{BC}$). In embodiments of the invention shown in FIGS. 4, 5, and 6, optical signals $h\nu_{in}$ are input to the device's optical input port, as initially represented in FIGS. 1 and 2; i.e., to the device base region, e.g. via an optical waveguide such as an optical fiber or an optical channel or waveguide of an opto-electronic circuit.

Figure 4:
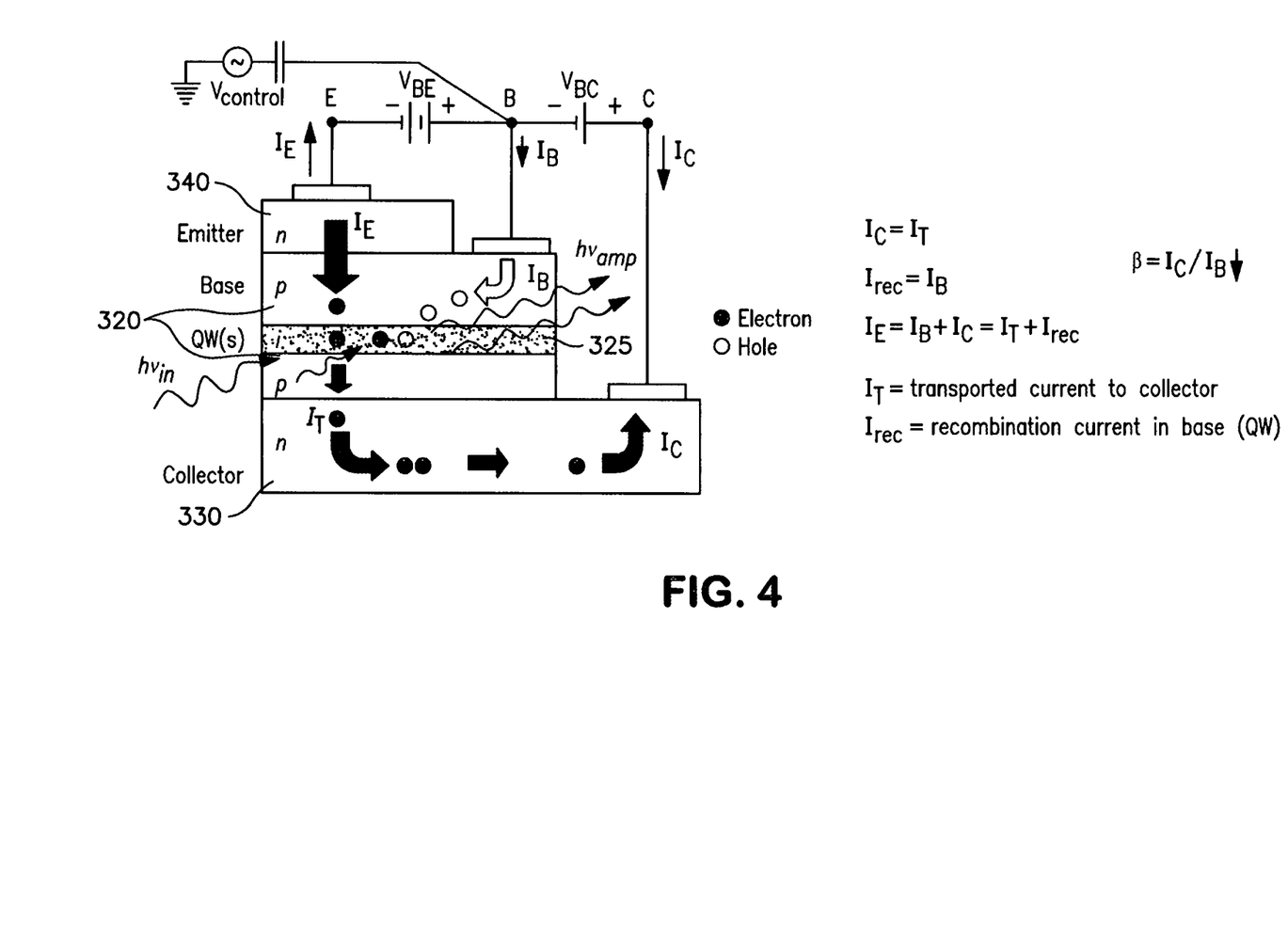
FIG. 4 illustrates the operation of a device and method of a modification of the FIG. 3 device, utilized in an optical amplification mode, and which shows, in simplified form, carrier flow in the device.

FIG. 4 shows an embodiment of the TLOA in an amplification mode. When the TLOA is forward biased at the BE junction and forward or zero biased at the BC junction ($V_{BE} \gg 0$ and $V_{BC} \sim$ or $>0$ V), the incident laser light will induce stimulated electron-hole recombination within the active QW region and result in optical amplification. From the transistor I-V curve, a decrease in electrical current gain, $\beta$, will be observed, due to the enhanced recombination in the base region. In this case, more carriers are consumed in the base ($I_B$ increases) than transported to the collector ($I_T$), thus $\beta$ decreases, resulting in gain compression. Control signal $V_{control}$, at the electrical input port, controls the light amplification.

Figure 5:
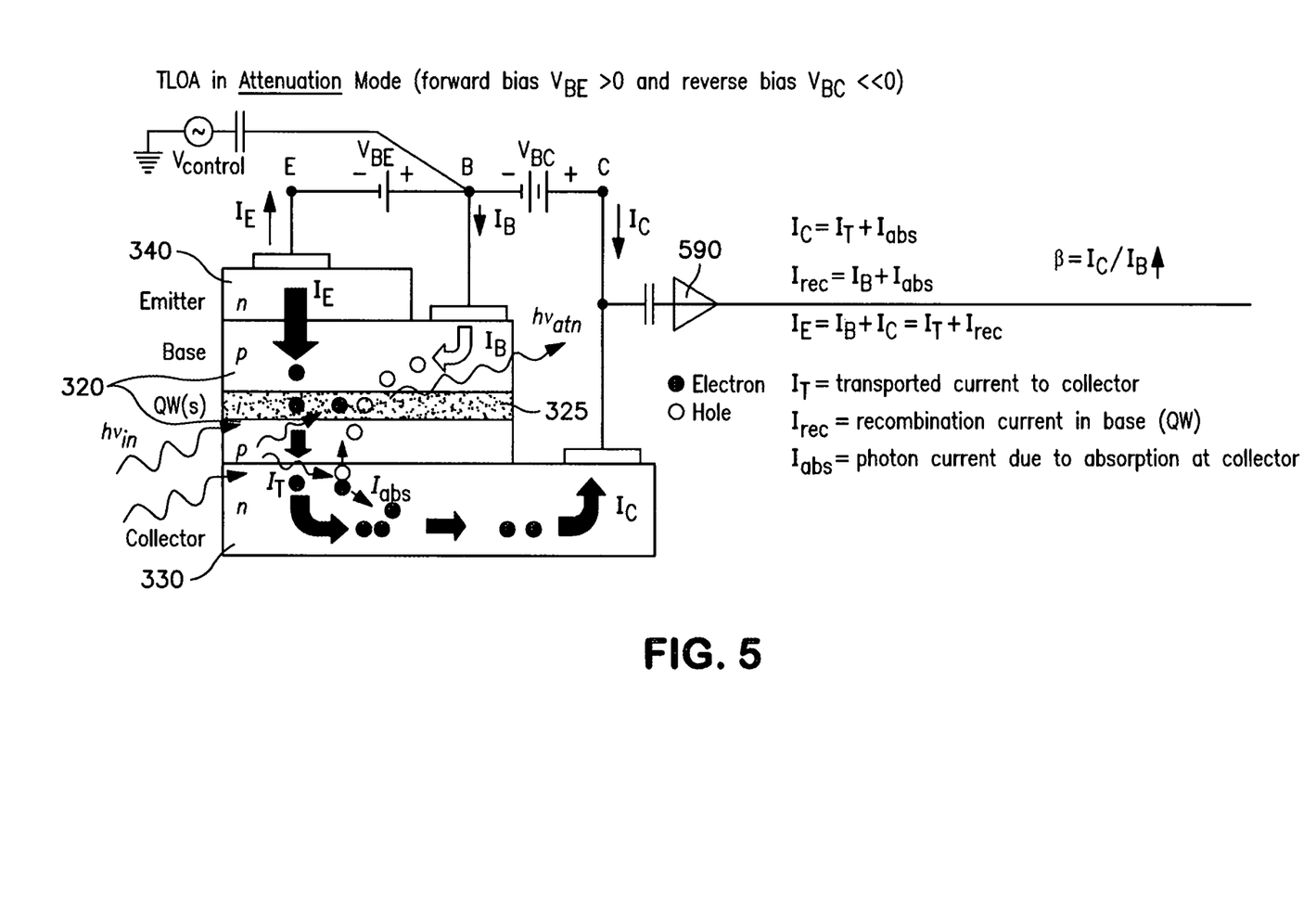
FIG. 5 illustrates the operation of a device and method of a modification of the FIG. 3 device, utilized in an optical attenuation mode, and which shows, in simplified form, carrier flow in the device.

FIG. 5 shows an embodiment of the TLOA in an optical attenuation mode. When the TLOA is forward biased at the BE junction and strongly reverse biased at the BC junction ($V_{BE} > 0$ and $V_{BC} \ll 0$), as shown in FIG. 5, the incident laser light will be absorbed via photon-assisted tunneling (Franz-Keldysh effect) at the BC junction, resulting in optical attenuation. The absorbed photons will generate electron-hole pairs, with holes fed back into the base and electrons swept into the collector. In this case, the collector current ($I_C$) and $\beta$ will increase, which can be observed from the I-V characteristics. The increased attenuation will cause more gain increase from the electrical I-V curve. The increased collector current can therefore be used for a feedback control of optical gain, allowing the TLOA to perform as a variable-gain optical amplifier with a feedback control circuit. In FIG. 5, the feedback control circuit is represented at 590, and the output thereof can be applied to the device electrical input port (e.g. $V_{control}$ as first represented in FIG. 4).

Figure 6:
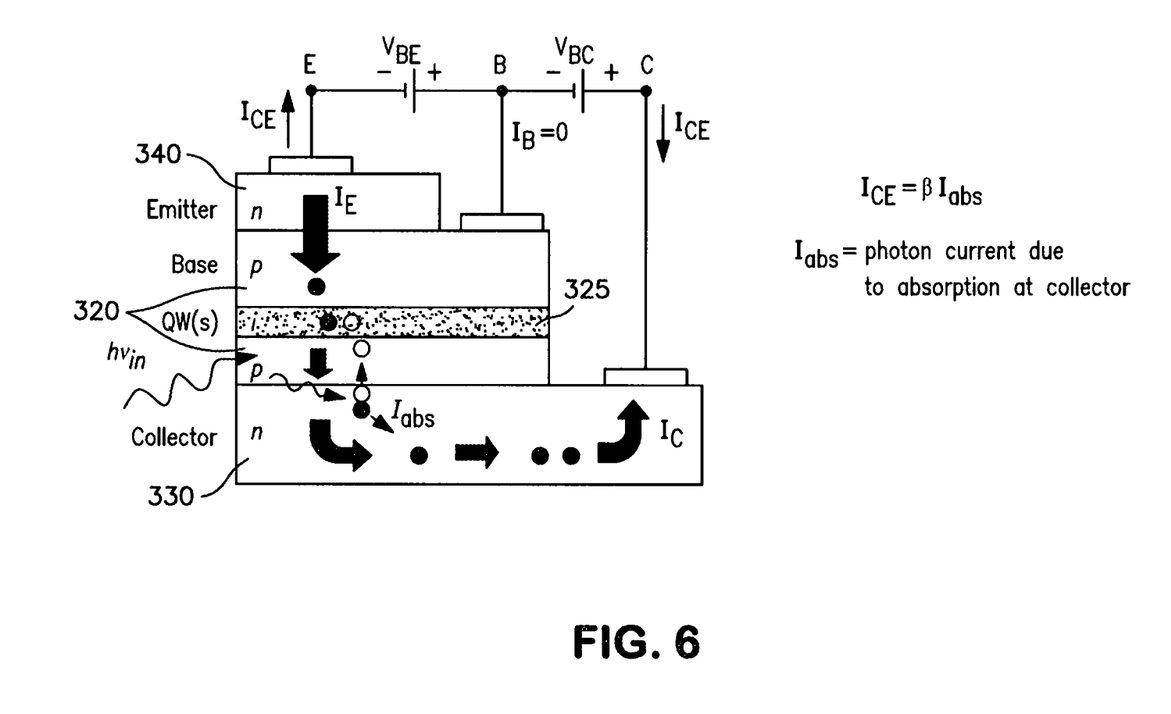
FIG. 6 illustrates the operation of a device and method of a modification of the FIG. 3 device, utilized in an optical photodetection mode, and which shows, in simplified form, carrier flow in the device.

FIG. 6 shows an embodiment of the device in a photodetection mode. Photodetection operates with high sensitivity due to the intrinsic gain of the transistor. This mode operates with the BE junction forward biased ($V_{BE} > 0$) and the BC junction in reverse bias ($V_{BC} \ll 0$) and with the base terminal open. Similar to the attenuation mode, the injected light absorbed at the base-collector junction generates a photocurrent that feeds into the base of the device. Electrons are thus injected from the emitter in accord with the change in the base current due to the incident light illumination. The base terminal is able to be biased at a voltage providing a dc level enhancing the performance. Tunable gain and bandwidth (sensitivity or responsivity) of the device can be achieved using selected QW design.

Figure 7:
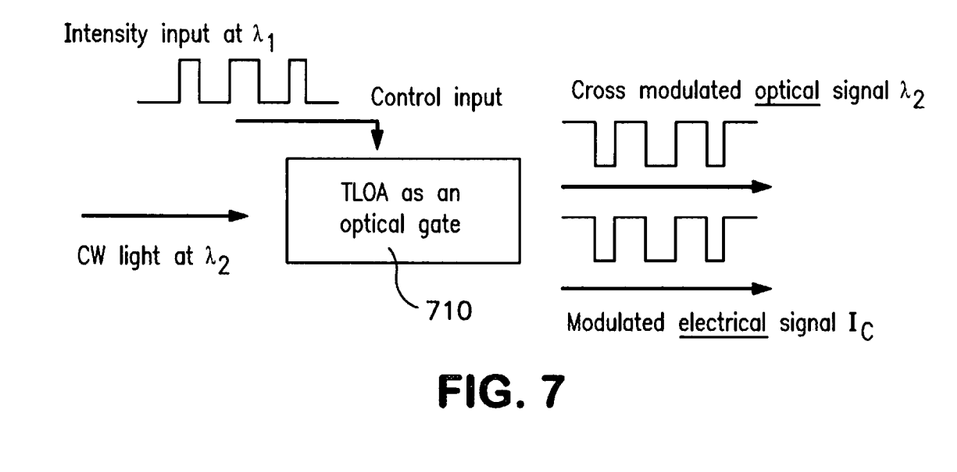
FIG. 7 is a diagram illustrating the operation of an embodiment of the transistor optical amplifier hereof utilized as an optical gate switch.
Figure 8:
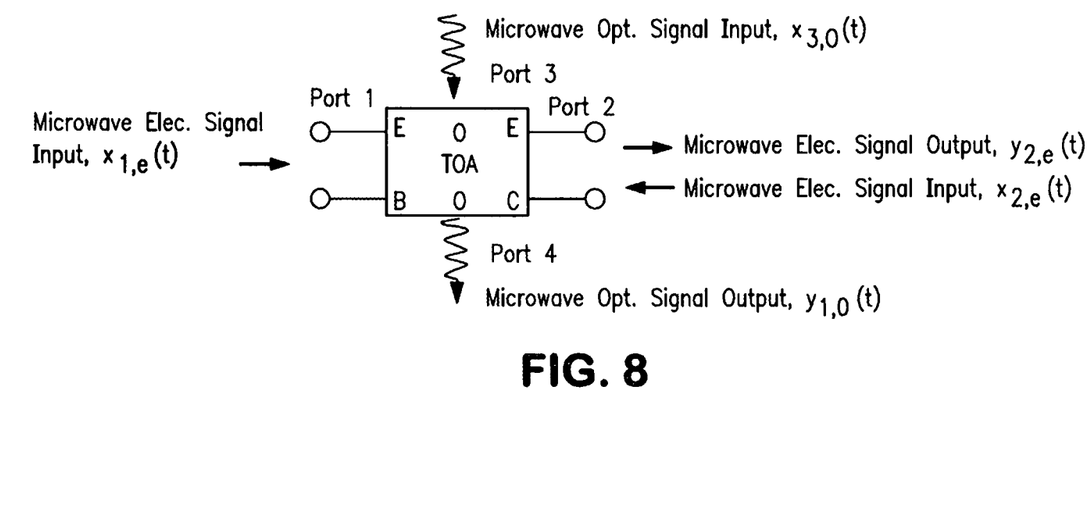
FIG. 8 is a diagram illustrating the use of a four port optical amplifier hereof utilized as an opto-electronic signal mixing device employed for up frequency and down frequency conversion.

In further embodiments of the invention, the TLOA is employed as a multi-GHz optical gate switch and signal mixer. In the example of FIG. 7, the optical gate 710 can be, for example, the TLOA of FIG. 4 in optical amplification mode. In this example, continuous wave (CW) light, at wavelength $\lambda_2$, is received at the optical input port of the TLOA and the modulating input signal, at wavelength $\lambda_1$, is received at the electrical input port of the TLOA. A cross modulated optical output signal is the optical output at the optical output port of the TLOA, and a corresponding modulated electrical signal is available at the electrical output port of the TLOA. Unlike the conventional semiconductor optical amplifier (SOA), the transistor laser optical amplifier (TLOA) has a fast recombination lifetime (in the tens of pico-sec range) due to its ability to remove excess carriers (slow recombination) in the base active region by a built-in reverse bias at the base-collector junction. (In this regard, see, for example, documents in the Background portion hereof that describe this phenomen in the context of light-emitting transistors and transistor lasers.)

As described in the documents listed in the Background portion hereof, in the transistor laser (TL) and light-emitting transistor (LET), the inherently fast carrier recombination can be tailored and reduced to lower than 23 ps, and an optical spontaneous modulation bandwidth of 7 GHz demonstrated in the LET. Therefore, it follows that the TLOA can have a fast switching time (several GHz switching speed) as compared to the conventional SOA (switching speed of about 1 GHz). In emerging photonic packet switching networks and short-range optical interconnects, the TLOA can replace current diode-based SOAs as both amplifier/attenuators and on/off gate because of its ability to be electrically modulated with three-terminal operation, its high extinction ratio, and its fast on/off switching speed.

The TLOA employs unique four-port characteristics and provides an electrical modulated output with an optical input, which is not available with diodes. The dual-input-output exhibits potential for signal-mixing, both electrically and optically. In the example of FIG. 7, $x_{1,e}(t)$, $x_{2,e}(t)$, and $x_{3,o}(t)$ are respectively a microwave electrical signal input, a further microwave electrical signal input, and a microwave optical signal input, and $y_{1,o}(t)$ and $y_{2,e}(t)$ are respectively a mixed microwave optical signal output and a mixed microwave electrical signal output. In this example, it is seen that the TLOA makes use of a second input electrical port that also serves as an electrical output port.

It will be understood that the transistor optical amplifiers hereof can have any desired directional configuration and operation, for example including lateral cavity (e.g. edge emitting) and/or vertical cavity configuration and operation, for optical input as well as for emission.

The invention has been described with reference to particular preferred embodiments, but variations within the spirit and scope of the invention will occur to those skilled in the art. For example, additional input and/or output ports, electrical and/or optical, can be implemented by providing, for instance, a further electrical terminal input to the device base region and/or further optical input or output waveguides (e.g. fiber optical waveguides) in communication with the device base region.

The invention claimed is:

1. A four port opto-electronic device, comprising:
   a light-emitting semiconductor device that includes a base region between collector and emitter regions, a base terminal coupled with said base region, a collector terminal coupled with said collector region, and an emitter terminal coupled with said emitter region;
   an electrical input port defined between a first pair of terminals from among said base, collector, and emitter terminals, and an electrical output port defined between a second different pair of terminals from among said base, collector, and emitter terminals;
   an optical input port optically coupled with said base region; and
   an optical output port optically coupled with said base region.

2. The four port opto-electronic device as defined by claim 1, wherein said optical input port comprises an input optical waveguide.

3. The four port opto-electronic device as defined by claim 1, wherein said optical output port comprises an output optical waveguide.

4. The four port opto-electronic device as defined by claim 2, wherein said optical output port comprises an output optical waveguide.

5. The four port opto-electronic device as defined by claim 1, wherein said device includes an optical resonant cavity enclosing at least a portion of said base region, and wherein light emitted by said device comprises laser emission from said optical output port.

6. The four port opto-electronic device as defined by claim 4, wherein said input and output optical waveguides are integrated with a semiconductor structure forming said opto-electronic device.

7. A method for amplifying an input optical signal, comprising the steps of:
   providing a light-emitting transistor device comprising a base region between collector and emitter regions;
   applying electrical signals with respect to said base, collector, and emitter regions to produce light emission from the base region of said light-emitting transistor device; and
   applying said input optical signal to the base region of said light-emitting transistor device to produce an amplified optical output from said base region.

8. The method as defined by claim 7, further comprising providing an input optical port in optical communication with said base region, and wherein said input optical signal is coupled into said input optical port.

9. The method as defined by claim 7, further comprising providing an output optical port in optical communication with said base region, and wherein said output optical signal is coupled into said output optical port.

10. The method as defined by claim 8, further comprising providing an output optical port in optical communication with said base region, and wherein said output optical signal is coupled into said output optical port.

11. The method as defined by claim 7, further comprising applying electronic control signals to said light-emitting transistor to control said amplified optical output.

12. The method as defined by claim 7, wherein said step of providing a light-emitting transistor further comprises providing an optical resonant cavity enclosing at least a portion of said base region so that said light-emitting transistor operates as a transistor laser with the light emission from said base region comprising laser emission, and wherein said amplified optical output comprises amplified laser emission.

13. The method as defined by claim 12, wherein said input optical signal comprises a laser beam.

14. The method as defined by claim 12, further comprising applying electronic control signals to said transistor laser to control said amplified optical output.

15. The method as defined by claim 12, wherein base, collector, and emitter terminals are respectively coupled with said base, collector, and emitter regions, and further comprising providing an electrical input port between a first pair of terminals from among said base, collector, and emitter terminals, and further comprising applying electronic control signals to said electrical input port to control said amplified optical output.

16. The method as defined by claim 13, wherein base, collector, and emitter terminals are respectively coupled with said base, collector, and emitter regions, and further comprising providing an electrical input port between a first pair of terminals from among said base, collector, and emitter terminals, and further comprising applying electronic control signals to said electrical input port to control said amplified optical output.

17. A method of forming a four port opto-electronic device, comprising the steps of:
providing a light-emitting semiconductor device that includes a base region between collector and emitter regions, a base terminal coupled with said base region, a collector terminal coupled with said collector region, and an emitter terminal coupled with said emitter region;
providing an electrical input port between a first pair of terminals from among said base, collector, and emitter terminals, and an electrical output port between a second different pair of terminals from among said base, collector, and emitter terminals;
providing an optical input port optically coupled with said base region; and
providing an optical output port optically coupled with said base region.

18. The method as defined by claim 17, wherein said step of providing an optical input port comprises providing an input optical waveguide.

19. The method as defined by claim 18, wherein said step of providing an optical output port comprises an output optical waveguide.

20. The method as defined by claim 19, further comprising providing an optical resonant cavity enclosing at least a portion of said base region, and wherein light emitted by said device comprises laser emission from said optical output port.

21. The method as defined by claim 20, further comprising providing an input electrical signal coupled with said electrical input port.

22. The method as defined by claim 21, further comprising providing an output circuit for receiving an electrical output signal from said electrical output port.

23. The method as defined by claim 17, further comprising providing a biasing circuit coupled with said electrical input and electrical output ports for controlling operation of said device as an optical amplifier, an optical attenuator, or a photodetector.

24. The method as defined by claim 17, further comprising the steps of providing an input optical signal to said optical input port, and providing an input electrical control signal to said electrical input port, to produce an output optical signal that is modulated as a function of said input electrical control signal.

25. The method as defined by claim 24, further comprising the step of receiving an electrical signal from said electrical output port that is indicative of the modulated optical output signal.

26. The method as defined by claim 17, wherein said step of providing said light-emitting semiconductor device further comprises providing a III-V transistor structure with a heavily doped base region.

27. The method as defined by claim 21, further comprising providing a second input electrical signal applied to said electrical input port.

28. The method as define by claim 17, further comprising providing an additional terminal coupled with one of said base region, collector region, or emitter region, and providing an additional electrical input port between said additional terminal and the terminal coupled with another of said regions.

29. The method as defined by claim 28, wherein said step of providing an additional terminal comprises providing said additional terminal coupled with said base region, and wherein said step of providing an additional electrical input port comprises providing said additional electrical input port between said additional terminal and the terminal coupled with said emitter region or the terminal coupled with said collector region.

* * * * *